United States Patent [19]
Petri

[11] Patent Number: 5,281,149
[45] Date of Patent: Jan. 25, 1994

[54] GROUNDING CIRCUIT BOARD STANDOFF

[76] Inventor: Hector D. Petri, 384 Edmands Rd., Framingham, Mass. 01701

[21] Appl. No.: 909,337

[22] Filed: Jul. 6, 1992

[51] Int. Cl.⁵ .............................................. H01R 9/09
[52] U.S. Cl. ................... 439/66; 174/138 D; 439/74; 439/95
[58] Field of Search ............... 439/65, 66, 74, 75, 439/92, 95; 174/138 E, 138 D, 138 G

[56] References Cited

U.S. PATENT DOCUMENTS

| | | | |
|---|---|---|---|
| 4,855,873 | 8/1989 | Bhargava et al. | 174/138 D |
| 4,938,703 | 7/1990 | Nakano | 174/138 D |
| 5,059,130 | 10/1991 | Miller, Jr. | 439/74 |

Primary Examiner—Paula A. Bradley
Attorney, Agent, or Firm—John E. Toupal; Harold G. Jarcho

[57] ABSTRACT

A circuit board standoff including a body adapted for disposition between first and second boards so as to maintain a predetermined minimum spacing between facing sides thereof; a stem fixed to the body and adapted to engage an opposite side of the first board; a fastener fixed to the body and adapted to engage an opposite side of the second board; and a ground mechanism retained by the standoff and including a first electrical contact adapted to engage the first board, a second electrical contact adapted to engage the second board, and an electrical connector connecting the first and second contacts.

17 Claims, 1 Drawing Sheet

GROUNDING CIRCUIT BOARD STANDOFF

BACKGROUND OF THE INVENTION

This invention relates generally to electrical circuit board apparatus and, more particularly, to electrical circuit board apparatus utilizing improved standoff elements for separating and supporting printed circuit boards.

Printed circuit boards are used extensively in various types of electrical equipment. Typically, standoff elements are used to support and provide spacing for circuit boards. Standoffs are used, for example, to separate, support and electrically insulate a printed circuit board from either a metal chassis or other printed circuit boards. In many applications, separated circuit boards include ground circuits that must be interconnected. Typically, such grounding connections are accomplished with cumbersome leads extending between the separated boards. U.S. Pat. No. 4,952,158 discloses a conductive standoff for providing equal ground potentials on separated boards. However, the effectiveness and utility of this prior standoff is limited.

The object of this invention, therefore, is to provide an improved standoff device that can both separate and electrically interconnect printed circuit boards.

SUMMARY OF THE INVENTION

The invention is a circuit board standoff including a body adapted for disposition between first and second boards so as to maintain a predetermined minimum spacing between facing sides thereof; a stem fixed to the body and adapted to engage an opposite side of the first board; a fastener fixed to the body and adapted to engage an opposite side of the second board; and a ground mechanism retained by the standoff and including a first electrical contact adapted to engage the first board, a second electrical contact adapted to engage the second board, and an electrical connector connecting the first and second contacts. The ground mechanism can be utilized to establish equal ground potential for the first and second boards.

According to one feature of the invention, the ground mechanism is at least partially formed with resilient material that forces the first contact against the facing side of the first board and forces the second contact against the facing side of the second board. The resilient material provides good contact resistance for the ground mechanism.

According to another feature of the invention, the first and second contacts are normally separated by a distance greater than the predetermined spacing. This feature produces compression of the ground mechanism between the boards and a resultant increase in the forces applied to the contacts.

According to another feature of the invention, the ground mechanism is a unitary piece stamped from a resilient material having good electrical conductance such as spring tempered phosphor bronze, or beryllium copper. This feature provides desired operational characteristics with minimum cost.

According to other features of the invention, the connector includes a first ring portion retaining the first contact and a second ring portion retaining the second contact, and the body extends through the first and second ring portions. This configuration insures secure retention of the ground mechanism between the boards.

According to still other features of the invention, the second contact is formed by a plurality of tab portions projecting from the second ring portion and adapted to engage the facing side of the second board, and the first contact is formed by a plurality of nipple portions projecting from the first ring portion and adapted to engage the facing side of the first board. The tab and nipple portions facilitate good electrical contact with the boards.

DESCRIPTION OF THE DRAWINGS

These and other objects and features of the invention will become more apparent upon a perusal of the following description taken in conjunction with the accompanying drawings wherein.

DESCRIPTION OF THE PREFERRED EMBODIMENTS

Figure 10:
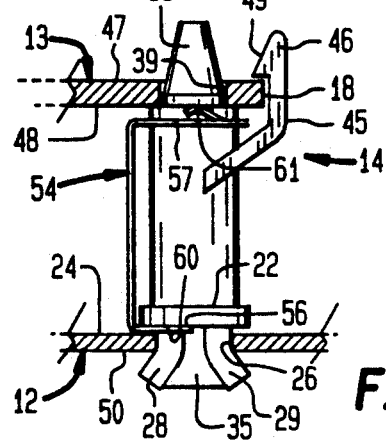
FIG. 10 is a view partially in cross section of a circuit board assembly according to the invention.

A circuit board assembly depicted in FIG. 10 includes a first board 12 separated from a second board 13 by a standoff 14. One side 24 of the first board 12 faces one side 48 of the second board 13. Typically, the first board 12 and the second board 13 might be printed circuit boards used in electrical equipment. Also, it will be understood that the first and second boards 12, 13 normally would be connected by a plurality of the standoffs 14 as required for desired separation and support.

The standoff 14 (FIGS. 1-5) comprises a spacer body 17 including an actuator pin 16 and a sleeve member 15, and a fastener portion 19 engaging an edge 18 of the second board 13. An upper portion 21 of the open ended sleeve 15 is disposed between the first and second boards 12, 13 and defines at one end a shoulder portion 22 engaging a surface area on one side 24 of the first board 12. A lower stem portion 25 of the sleeve 15 extends through an opening 26 in the first board 12 and terminates with a bifurcated latch portion 27. Forming the latch portion 27 are radially expandable bifurcations 28, 29 initially spaced apart by a distance less than an inner diameter of the stem portion 25 and an inner diameter of the upper portion 21.

The actuator pin 16 has a shank portion 35 and a head portion 36 joined by a flange portion 37. Receiving internally the shank portion 35 of the actuator pin 16 are the upper sleeve portion 21, the stem portion 25 and the latch portion 27 of the spacer body 17. Travel of the shank portion 35 into the open ended sleeve 15 is limited by engagement between an end 38 of the sleeve 15 and the flange portion 37 of the actuator pin 16. An outer diameter of the shank portion 35 of the actuator pin 16 is greater than the normal spacing between the bifurcations 28, 29 of the latch portion 27 but less than the inner diameters of the stem portion 25 and the upper sleeve portion 21. The head portion 36 of the pin 16 projects through a hole 39 in the second board 13.

Forming the fastener 19 is a resilient appendage 43 of the upper sleeve portion 21. A first leg 44 of the appendage 43 has one end fixed to the upper sleeve portion 21 and extends transversely therefrom. Extending from an outer end of the first leg 44 in the direction of separation of the first and second boards 12, 13 is a second leg 45 that engages the edge 18 of the second board 13. A third leg 46 extends from an outer end of the second leg 45 in a direction parallel to the second board 13. The third leg 46 engages an opposite side 47 of the second board 13 so as to prevent separation thereof from the first board 12. Also the flange portion 37 of the actuator pin 16 engages the facing side 48 of the second board 13 to establish a minimum spacing thereof from the first board 12. A tapered portion of the third leg 46 forms a cam surface 49.

Figure 1:
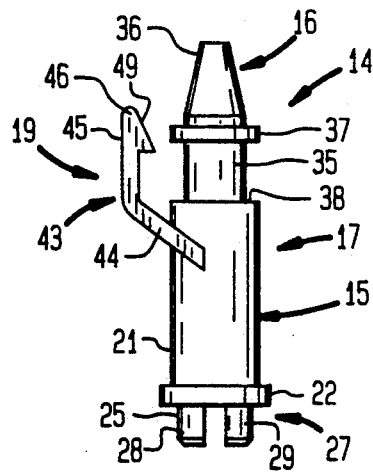
FIG. 1 is a side view of a standoff according to the invention.
Figure 2:
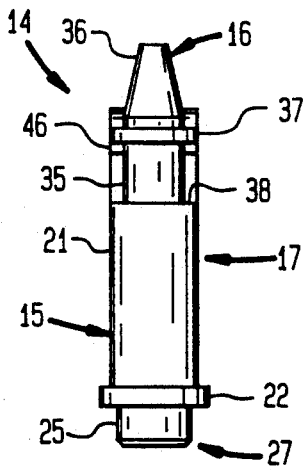
FIG. 2 is a front view of the standoff illustrated in FIG. 1.
Figure 3:
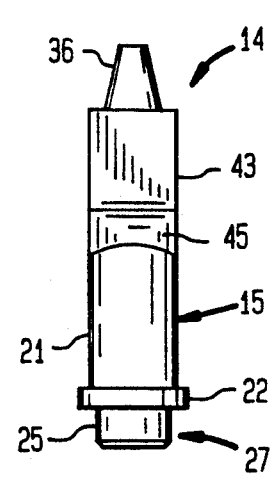
FIG. 3 is a rear view of the standoff illustrated in FIG. 1.
Figure 8:
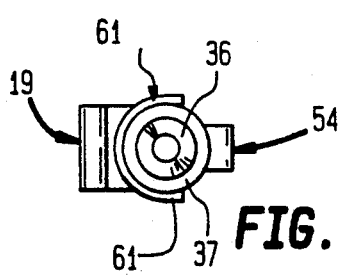
FIG. 8 is a top view of the assembly illustrated in FIG. 7.
Figure 4:
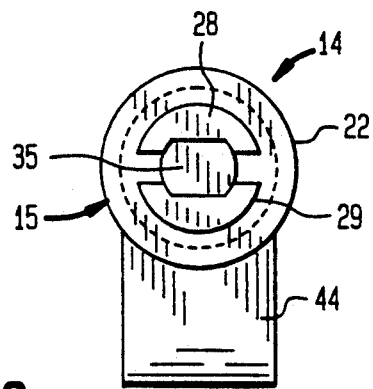
FIG. 4 is a bottom view of the standoff illustrated in FIG. 1.
Figure 5:
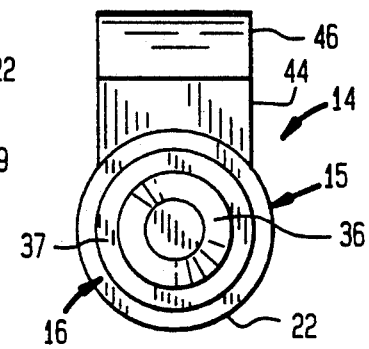
FIG. 5 is a top view of the standoff illustrated in FIG. 1.
Figure 7:
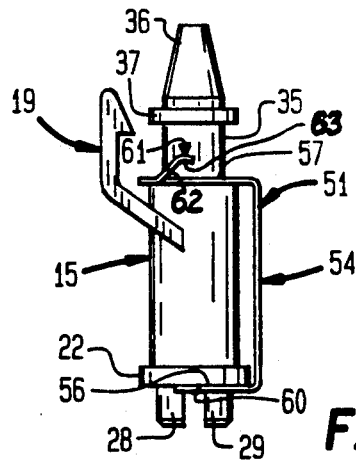
FIG. 7 is a side view of an assembly of the standoff shown in FIG. 1 and the grounding element shown in FIG. 6.
Figure 9:
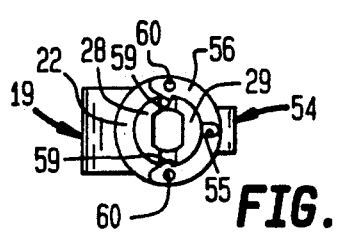
FIG. 9 is a bottom view of the assembly illustrated in FIG. 7.
Figure 6:
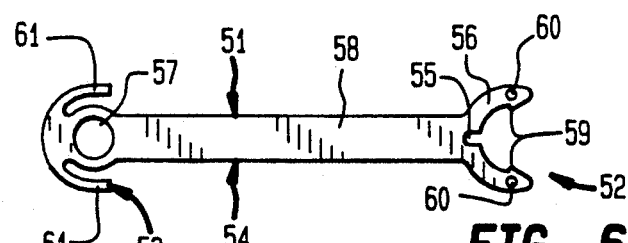
FIG. 6 is a plan view of a grounding element for use with the standoff illustrated in FIG. 1.

The standoff 14 also includes a grounding element 51 retained by the spacer body 15. As shown in FIGS. 6–9, the grounding element 51 includes first electrical contacts 52 and second electrical contacts 53 joined by an electrical connector portion 54. Terminating opposite ends of a middle portion 58 of the connector portion 54 are, respectively, a U-shaped first portion 56 and a ring second portion 57. The U-shaped first portion 56 has an inner circumference conforming to the stem portion 25 and intersected by a centrally disposed slot 55 and the ring second portion 57 has an inner diameter substantially equal to the outer diameter of the shank portion 35 of the pin 16. Projecting radially inwardly from each end of the U-shaped portion 56 is an ear 59. The first contacts 52 are nipple portions 60 projecting from the first portion 56 while the second contacts 53 are tab portions 61 projecting from the second portion 57. Preferably, the grounding element 51 is a stamping formed with a suitable resilient, electrically conductive material such as spring tempered phosphor bronze or beryllium copper. After the element is stamped as shown in FIG. 6, the first and second portions 56, 57 are bent transversely to the middle connector portion 58 as shown in FIG. 7. Also each of the tab portions 61 are bent to form an outwardly projecting leg portion 62 terminating with an inwardly curved contact portion 63. After completion of the grounding element 51, the nipple portions 60 are spaced from the contact portions 63 by a distance greater than the predetermined spacing between the first and second boards 12, 13.

During construction of the circuit board assembly 11 shown in FIG. 10, a, plurality of standoffs are assembled by inserting a U-shaped first portion 56 on one of the grounding elements 51 over the stem portion 25 of each. During this operation, the slot 55 facilitates expansion of the first portion 56 and then allowing the ears 59 to snap into retained positions between the bifurcations 28, 29. Next, the latch portion 27 and stem portion 25 of each standoff spacer 15 are inserted through an opening 26 in the first board 12. The shank portion 35 of each actuator pin 16 is then inserted into the sleeve 15 with the ring second portion 57 securely sandwiched between the flange portion 37 and the end 38 of the upper sleeve portion 21. Because of its relatively small outer diameter, the shank portion 35 of the pin 16 passes freely through the upper sleeve portion 21 and the stem portion 25. However, upon entering into the latch portion 27, the outer diameter of the shank portion 35 engages and radially expands the bifurcations 28, 29 into engagement with an opposite side 50 of the first board 12 opposite to the one side 24 facing the board 13. Accordingly, the spacer sleeve 15 becomes securely fixed to the first board 12. In addition, internal burrs on the ring portion 57 engage the shank portion 35 to retard removal of the pin 16 from the sleeve 15.

The second board 13 is mounted next by passing a hole 39 over each head portion 36 until the side 48 facing the board 12 engages the flange portion 37 of the actuator pin 16. During this relative movement between the second board 13 and the body portion 21, the edge 18 engages the cam surface 49 on the third leg 46 forcing the resilient appendage 54 outwardly to permit further movement of the board 13 into engagement with the flange portion 37. After passage of the edge 18 by the third leg 46, the relaxation forces cause the resilient appendage 43 to deflect inwardly into its original position wherein the third leg 46 engages the opposite side 47 of the board 13. Thus, the second board 13 is fixed securely relative to the first board 12.

As the second board 13 is pressed into position under the third legs 46, a spacing is established between the boards 12, 13 that is less than the total length of each grounding element 51. The resilient tab portions 61, therefore, are engaged by the surface 48 of the board 13 and flexed thereby into compressed positions as shown in FIG. 10. Because of that compression, the resilient grounding elements 51 are placed in contraction and exert forces that force the first contact nipple portions 60 against the side 24 of the first board 12 to establish substantially point contacts therebetween and the tab contact portions 61 against the side 48 of the second board 13 to establish substantially point contacts therebetween. With ground circuits (not shown) on the first board 12 connected to that portion of the side 24 engaged by the nipple portions 60 and ground circuits (not shown) on the second board 13 connected to that portion of the second board 13 engaged by the tab contact portions 61, a solid ground connection is established between the boards 12, 13 by the grounding elements 15.

If desired, the standoffs 14 can be easily disassembled to permit separation of the boards 12, 13. First, each resilient appendage 43 is flexed outwardly to move the third leg 46 beyond the edge 18 thereby allowing the second board 13 to be lifted off the flange portion 37 of the actuator pin 16. Next, each actuator pin 16 is forced upwardly out of the latch portion 27 and then withdrawn from the upper sleeve and stem portions 21, 25 after which the sleeve 15 is withdrawn from the opening 26 in the first board 12.

Obviously, many modifications and variations of the present invention are possible in light of the above teachings. It is to be understood, therefore, that the invention can be practiced otherwise than as specifically described.

What is claimed is:

1. A circuit board standoff comprising:
   body means adapted for disposition between first and second boards so as to maintain a predetermined minimum spacing between facing sides thereof;

stem means fixed to said body means and adapted to engage an opposite side of the first board;

fastener means fixed to said body means and adapted to engage an opposite side of the second board; and ground means retained by said standoff and comprising first electrical contact means adapted to engage the first board at a plurality of substantially point contacts, second electrical contact means normally separated from said first contact means by a distance greater than the predetermined spacing and adapted to engage the second board at a plurality of substantially point contacts, and electrical connector means connecting said first and second contacts; said ground means being at least partially formed with a resilient material adapted to exert forces that force said first contact means against the facing side of the first board and force said second contact means against the facing side of the second board.

2. A standoff according to claim 1 wherein said ground means is a unitary piece.

3. A standoff according to claim 2 wherein said unitary piece is an electrically conductive metal stamping.

4. A standoff according to claim 3 wherein said stamping is spring tempered.

5. A standoff according to claim 3 wherein said stamping is phosphor bronze.

6. A standoff according to claim 2 wherein said connector means includes a U-shaped first portion retaining said first contact means and a ring second portion retaining said second contact means, and said body means extends through said first and second portions.

7. A standoff according to claim 6 wherein said first contact means is formed by a plurality of nipple portions projecting from said first portion and adapted to engage the facing side of the first board.

8. A standoff according to claim 6 wherein said second means is formed by a plurality of tab portions projecting from said second portion and adapted to engage the facing side of the second board.

9. A standoff according to claim 8 wherein said first contact means is formed by a plurality of nipple portions projecting from said first portion and adapted to engage the facing side of the first board.

10. A standoff according to claim 9 wherein said body means and said stem means comprise a sleeve defining a shoulder portion adapted to engage the facing side of the first board and an expandable portion projecting from said shoulder portion and adapted for insertion through an opening in the first board and for radial expansion into engagement with the opposite side thereof, said body means further comprises a pin insertable into said sleeve to engage said expandable portion and produce said radial expansion thereof, and said first portion is adapted for forcible engagement between said shoulder portion and the facing side of the first board.

11. A standoff according to claim 10 wherein said pin includes a shank portion for insertion into said sleeve, a head portion for insertion through a hole in the second board, and a flange portion joining said shank and head portions; and said second portion is adapted for disposition between said sleeve and said flange portion.

12. A standoff according to claim 11 wherein said fastener means is an appendage of said sleeve, said appendage including a first leg portion extending transversely from said sleeve, a second leg portion extending from an outer end of said first leg portion in the direction of separation of the first and second boards, and a third leg portion extending from an outer end of said second leg portion and adapted to engage the opposite side of the second board.

13. A standoff according to claim 6 wherein said body means and said stem means comprise a sleeve defining a shoulder portion adapted to engage the facing side of the first board and a shank portion having expandable bifurcations projecting from said shoulder portion and adapted for insertion through an opening in the first board and for radial expansion into engagement with the opposite side thereof, said body means further comprises a pin insertable into said sleeve to engage said bifurcations and produce said radial expansion thereof, and said first portion is adapted for forcible engagement between said shoulder portion and the facing side of the first board.

14. A standoff according to claim 13 wherein said pin includes a shank portion for insertion into said sleeve, a head portion for insertion through a hole in the second board, and a flange portion joining said shank and head portions; and said ring second portion has an inner edge engaging said shank portion and is disposed between said sleeve and said flange portion.

15. A standoff according to claim 14 wherein said fastener means is an appendage of said sleeve, said appendage including a first leg portion extending transversely from said sleeve, a second leg portion extending from an outer end of said first leg portion in the direction of separation of the first and second boards, and a third leg portion extending from an outer end of said second leg portion and adapted to engage the opposite side of the second board.

16. A standoff according to claim 13 wherein said U-shaped portion defines inwardly directed ears disposed for engagement between said bifurcations.

17. A standoff according to claim 16 wherein said U-shaped portion has an inner edge defining a centrally disposed slot for facilitating expansion thereof.

* * * * *